US007330168B2

(12) United States Patent
Anzai

(10) Patent No.: US 7,330,168 B2
(45) Date of Patent: Feb. 12, 2008

(54) DISPLAY DEVICE

(75) Inventor: Katsuya Anzai, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 411 days.

(21) Appl. No.: 10/426,023

(22) Filed: Apr. 30, 2003

(65) Prior Publication Data
US 2004/0012548 A1 Jan. 22, 2004

(30) Foreign Application Priority Data
Apr. 30, 2002 (JP) ............................. 2002-128008

(51) Int. Cl.
*G09G 3/30* (2006.01)
*G09G 3/10* (2006.01)
(52) U.S. Cl. ..................................... 345/76; 315/169.3
(58) Field of Classification Search ............... 315/169.3
See application file for complete search history.

(56) References Cited

U.S. PATENT DOCUMENTS

| 5,874,770 | A | * | 2/1999 | Saia et al. ................. 257/536 |
| 6,046,547 | A | * | 4/2000 | Nishio et al. ............ 315/169.3 |
| 6,137,551 | A | * | 10/2000 | Jeong ......................... 349/38 |
| 6,476,419 | B1 | * | 11/2002 | Yasuda ........................ 257/72 |
| 6,555,473 | B2 | * | 4/2003 | Yang ......................... 438/685 |
| 6,593,592 | B1 | * | 7/2003 | Yamazaki et al. ............ 257/71 |
| 6,596,596 | B2 | * | 7/2003 | Yang ......................... 438/287 |
| 6,955,953 | B2 | * | 10/2005 | Yamazaki et al. ........... 438/162 |
| 2003/0011317 | A1 | * | 1/2003 | Koyama .................... 315/169.3 |
| 2003/0048395 | A1 | * | 3/2003 | Yasui ........................... 349/43 |
| 2003/0128173 | A1 | * | 7/2003 | Ko ............................... 345/82 |
| 2003/0186489 | A1 | * | 10/2003 | Ishikawa ..................... 438/155 |

FOREIGN PATENT DOCUMENTS

| JP | 2000-231347 | 8/2000 |
| JP | 2001-282137 | 10/2001 |
| JP | 2001-282137 A | 10/2001 |

* cited by examiner

*Primary Examiner*—Sumati Lefkowitz
*Assistant Examiner*—Srilakshmi K Kumar
(74) *Attorney, Agent, or Firm*—Morrison & Foerster LLP

(57) ABSTRACT

A source of a driving transistor for driving an organic EL element functions as a first capacitance electrode layer. A second capacitance electrode layer is formed on the source through a gate insulating film of the driving transistor. The second capacitance electrode layer is formed with the same layer and by the same process as the gate electrode. A third capacitance electrode layer is formed extending over the second capacitance electrode layer through the interlayer insulating film. The third capacitance electrode layer is formed with the same layer as the drain electrode and the drain signal line. The third capacitance electrode layer is connected to the source of the driving transistor. The forming area of the storage capacitance element for holding the video signal supplied to the gate of the driving transistor can be thus reduced, improving display quality as well as extending life span of the organic El element.

22 Claims, 4 Drawing Sheets

DISPLAY DEVICE

BACKGROUND OF THE INVENTION

1. Field of the Invention

This invention relates to an electroluminescent display device, especially to an electroluminescent display device with a storage capacitance element for holding a video signal supplied to a gate of a driving transistor.

2. Description of the Related Art

An electroluminescent (referred to as EL hereinafter) display device with an EL element has been gathering attention as a display device substituting a CRT or an LCD. The development effort for the EL display device with a thin film transistor (referred to as TFT hereinafter) as a switching element for driving the EL element has been made accordingly.

FIG. 4 is an equivalent circuit diagram of one pixel of an organic EL display device. A gate signal line 51 for supplying a gate signal Gn and a drain signal line 52 for supplying a drain signal, a video signal Dm, cross each other.

An organic EL element 60, a driving TFT 40 for driving the organic EL element 60, and a pixel selecting TFT 30 for selecting the pixel are disposed near the crossing of the two signal lines. The TFT 40 is P-channel type and the TFT 30 is N-channel type.

A drain 43d of the organic El element driving TFT 40 is provided with a plus source voltage PVdd. A source 43s of the TFT 40 is connected to an anode 61 of the organic EL element 60.

The gate signal line 51 is connected to a gate 31 of the pixel selecting TFT 30 and provided with the gate signal Gn. The drain signal line 52 is connected to a drain 33d of the pixel selecting TFT 30 and provided with the video signal Dm. A source 33s of the TFT 30 is connected to a gate 41 of the TFT 40. The gate signal Gn is outputted from a gate driver circuit not shown in the figure, and the video signal Dm is outputted from a drain driver circuit not shown in the figure.

Also, the organic EL element 60 includes the anode 61, a cathode 65, and an emissive layer 63 inserted between the anode 61 and the cathode 65. The cathode 65 is provided with a minus source voltage CV.

A storage capacitance element 130 is connected to the gate 41 of the TFT 40. That is, one of the electrodes of the storage capacitance element 130 is connected to the gate 41, and the other electrode is connected to a storage capacitance electrode 131. The storage capacitance element 130 is disposed in order to hold the video signal Dm of the display pixel for one field period by keeping the electric charge corresponding to the video signal Dm.

The operation of the EL display device with the above configuration is as follows. The TFT 30 turns on when the gate signal Gn becomes high level for one horizontal period. Then, the video signal Dm is supplied from the drain signal line 52 to the gate 41 of the TFT 40 through the TFT 30. The conductance of the TFT 40 changes according to the video signal Dm supplied to the gate 41 and the corresponding driving electric current is applied to the organic EL element 60 through the TFT 40. Thus, the organic EL element 60 emits light.

FIG. 5 shows a cross-sectional view of the storage capacitance element 130 mentioned above. The TFT 30 is formed on an insulating substrate 10. The TFT 30 has the source 33s, the drain 33d, and the gate 31 formed on a gate insulating film 12. The storage capacitance electrode 131 is formed on the source 33s of the TFT 30 through the gate insulating film 12. The storage capacitance electrode 131 is provided with a predetermined stable voltage.

The storage capacitance element 130 is disposed for each of the pixels, in the conventional organic El display device, in order to maintain the voltage applied to the gate of the driving transistor for controlling the quantity of the electric current, which determines the luminescence of the organic El element 60.

When the voltage of the video signal Dm supplied to the pixel drops by a large quantity, it will affect the quality of the display. Therefore, a large capacitance value of the storage capacitance element 130 is required. That is, the area of the storage capacitance element 130 should be large.

There are a top emission type and a bottom emission type among the organic EL display devices. The light emitted from the organic EL element 60 radiates from the side of the organic EL element 60 opposite from the insulting substrate 10 in the top emission type display device. That is, the light radiates from the upper surface of the panel. On the other hand, the light emitted from the organic EL element 60 radiates from the side of the insulting substrate 10 in the bottom emission type display device.

When the area of the storage capacitance element 130 is large, it does not create any problem in the top emission type organic EL display device. However, the portion where the storage capacitance element is formed works as a blind in the bottom emission type display device, leading to decreased open aperture. In this configuration, the electric current supplied to the organic El element should be increased in order to acquire the necessary luminescence, compared to the case where the device has an enough open aperture. As a result, the life span of the organic EL element is shortened.

SUMMARY OF THE INVENTION

The invention provides an electroluminescent display device having a plurality of pixel portions. Each of the pixel portions includes an electroluminescent element, a driving transistor driving the electroluminescent element, a drain signal line, and a pixel selecting transistor supplying a signal from the drain signal line to a gate of the driving transistor. The pixel portion also includes a storage capacitance element holding the signal supplied to the gate of the driving transistor. The storage capacitance element includes an extension of a source of the pixel selecting transistor as a first capacitance electrode layer, a second capacitance electrode layer disposed above the extension of the source and a third capacitance electrode layer connected to the source and disposed above the second capacitance electrode layer.

The invention also provides an electroluminescent display device having a plurality of pixel portions. Each of the pixel portions includes an electroluminescent element having an anode layer, an emissive layer and a cathode layer, a driving transistor driving the electroluminescent element, a drain signal line, and a pixel selecting transistor supplying a signal from the drain signal line to a gate of the driving transistor. The pixel portion also includes a storage capacitance element holding the signal supplied to the gate of the driving transistor. The storage capacitance element includes an extension of a source of the pixel selecting transistor as a first capacitance electrode layer, a second capacitance electrode layer disposed above the extension of the source, a third capacitance electrode layer connected to the source and disposed above the second capacitance electrode layer, a fourth capacitance electrode layer connected to the third capacitance electrode layer and disposed above the third capacitance electrode layer and a fifth capacitance electrode layer disposed above the fourth capacitance electrode layer.

DETAILED DESCRIPTION OF THE INVENTION

Figure 1:
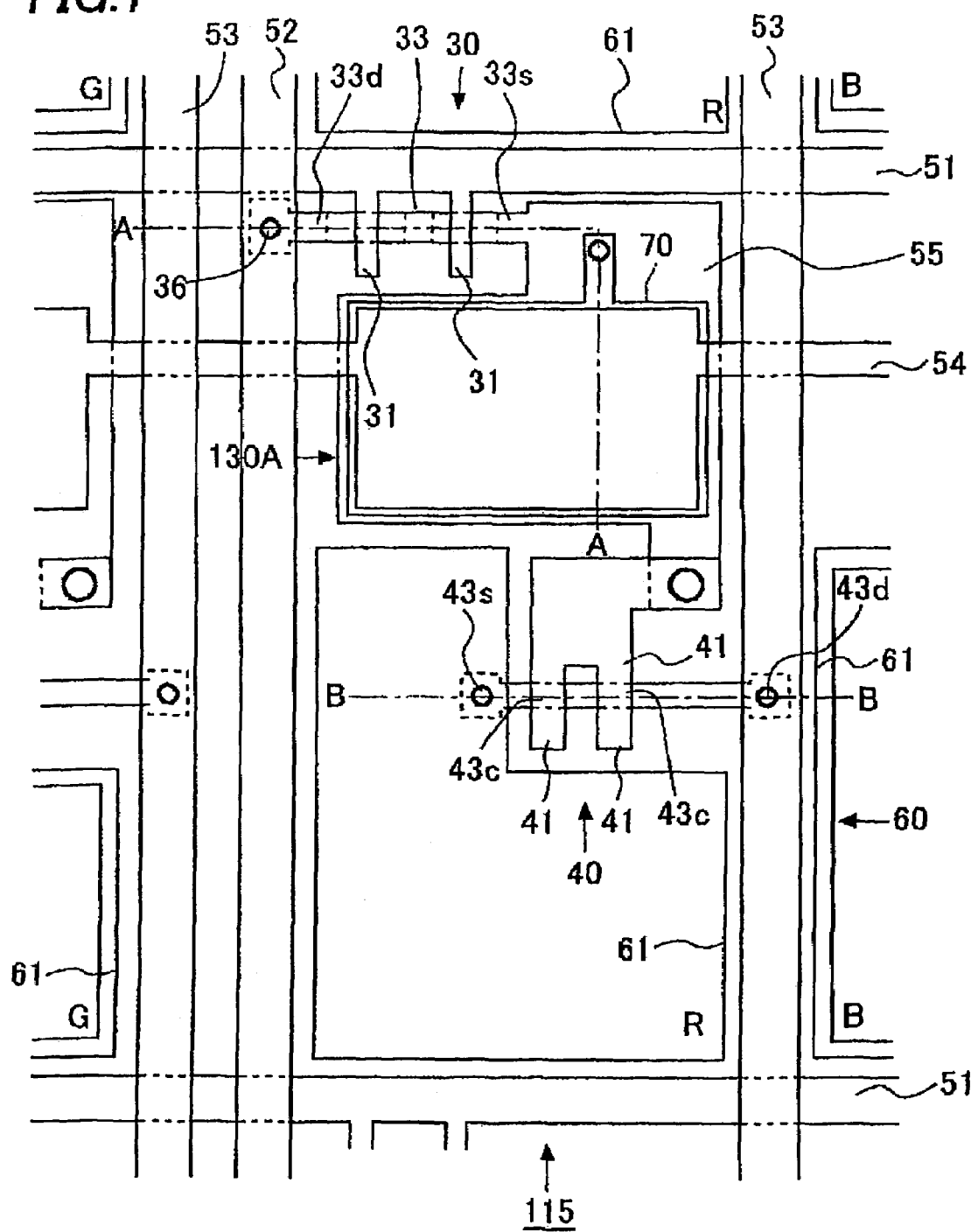
FIG. 1 is a plan view of one pixel portion of an organic EL display device of a first embodiment of this invention.
Figure 2A:
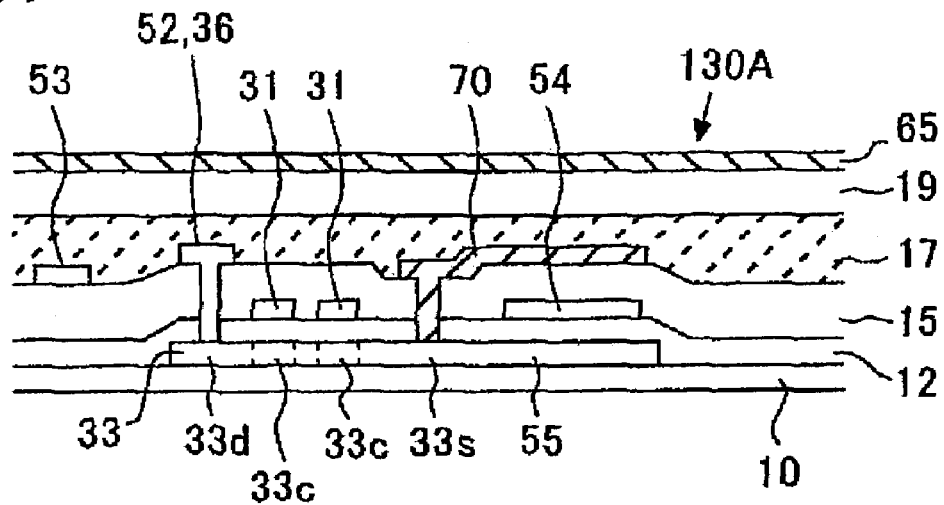
FIGS. 2A and 2B are cross-sectional views of the pixel portion of FIG. 1.
Figure 2B:
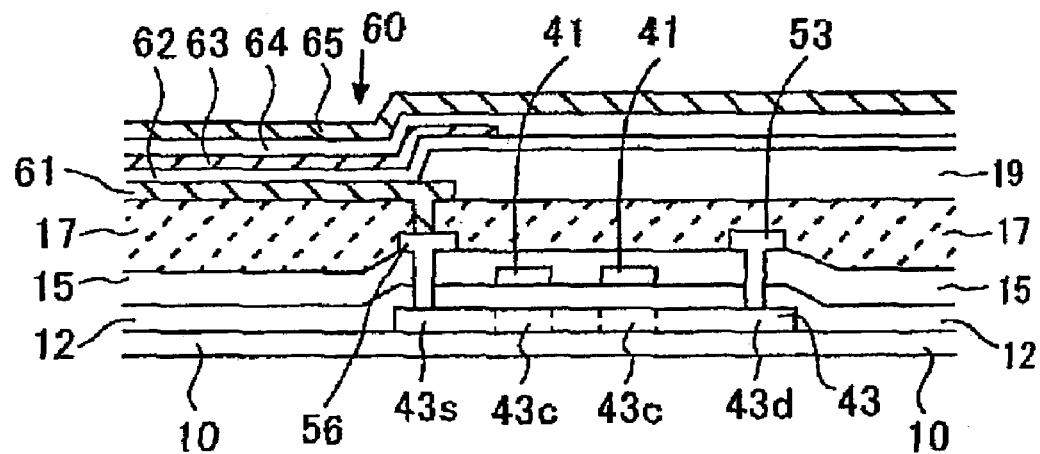
Figure 4:
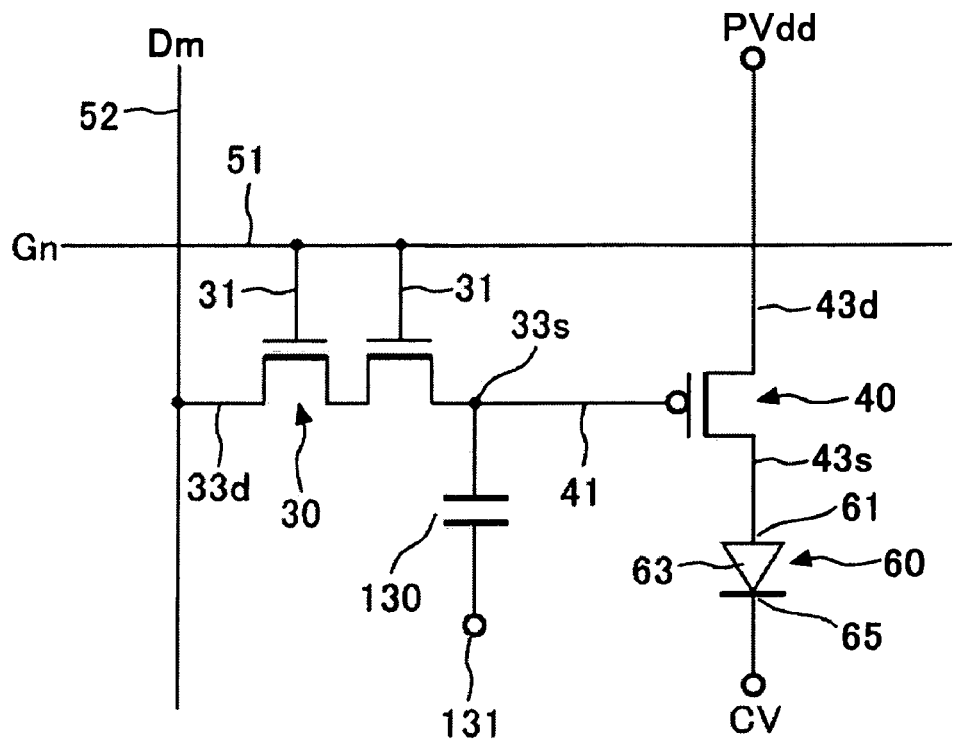
FIG. 4 is an equivalent circuit diagram of a pixel portion of a conventional organic El display device.
Figure 5:
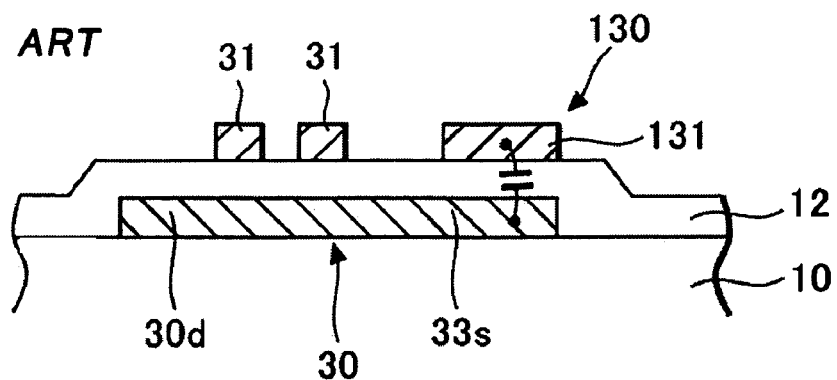
FIG. 5 is a cross-sectional view of the pixel portion of FIG. 4.

A first embodiment of this invention will be explained hereinafter. FIG. 1 is a plan view showing a pixel portion of an organic EL display device. FIG. 2A is a cross-sectional view of one pixel portion along the A-A line and, FIG. 2B is a cross-sectional view of the pixel portion along the B-B line in FIG. 1. The equivalent circuit diagram of the pixel portion is the same as shown in FIG. 4.

The pixel portion 115 is formed in the region surrounded with a gate signal line 51 and a drain signal line 52, as shown in FIGS. 1, 2A and 2B. A plurality of pixel portions is disposed in a matrix configuration, forming a display region.

An organic EL element 60, which is a self emissive element, a pixel election TFT 30 for controlling the timing of supplying electric current to the organic EL element 60, an organic El element driving TFT 40 for supplying electric current to the organic EL element 60, and a storage capacitance element 130A are disposed in the pixel portion 115. The organic EL element 60 includes an anode layer 61, an emissive layer made of an emissive material and a cathode layer 65.

The pixel selecting TFT 30 is disposed near the crossing of a gate signal line 51 a drain signal line 52. A source 33s of the TFT 30 works also as a first capacitance electrode layer 55, and is connected to a gate 41 of the TFT 40. A second capacitance electrode layer 54 is formed above the source 33s of the TFT 30 through a gate insulating film 12. The second capacitance electrode layer 54 is made of chrome or molybdenum, and disposed parallel to the gate signal line 51. Also, a third capacitance electrode layer 70 is formed above the second capacitance electrode layer 54 through an interlayer insulating film 15.

A source 43s of the organic EL element driving TFT 40 is connected to the anode layer 61 of the organic EL element 60, and a drain 43d is connected to a driving source line 53, which is an electric source supplied to the organic EL element 60.

The organic EL display device includes the TFTs and the organic EL element deposited sequentially on an insulating substrate 10, which is either a substrate made of a glass, a synthetic resin, a conductive material or a semiconductor, as shown in FIGS. 2A and 2B. When a conductive substrate or a semiconductor substrate is used as the insulating substrate 10, an insulating film 12 such a $SiO_2$ film or a SiN film should first be disposed before forming the TFTs 30, 40 and the organic EL element. Both TFTs have a top-gate configuration, where a gate electrode is disposed above an active layer through the gate insulating film 12.

Next, the detailed configuration of the pixel selecting TFT 30 and the storage capacitance element 130A will be explained. An amorphous silicon film (referred to as a-Si film hereinafter) is formed through a CVD method on the insulating substrate. The a-Si film is irradiated by a laser beam for re-crystallization from melt, forming a polycrystalline silicon film (referred to as a p-Si film, hereinafter). This layer functions as the active layer 33. Single layer or multiple layers of a $SiO_2$ film and a SiN film are formed on the p-Si film as the gate insulating film 12.

Then, the gate signal line 51 also working as the gate electrode 31 made of a metal with a high-melting point such as Cr and Mo as well as the drain signal line 52 made of Al are disposed. Also, the driving source line 53, which is made of Al and is an electric source of the organic El element 60, is disposed.

A $SiO_2$ film, a SiN film and a $SiO_2$ film are sequentially deposited to form the interlayer insulating film 15 on the entire surface of the gate insulating film 12 and the active layer 33. A drain electrode 36, which is formed by filling a contact hole formed at the location corresponding to the drain 33d with a metal such as Al, is disposed, and a first planarization film 17 made of an organic resin for flattening the surface is formed on the entire surface.

Next, the configuration of the storage capacitance element 130A will be explained. The source 33s of the TFT 30 functions also as the first capacitance electrode layer 55 The second capacitance electrode layer 54 is formed above the source 33s of the TFT 30, through the gate insulating film 12. The second capacitance electrode layer 54 is made of Cr or Mo, and formed in the same layer as the gate electrode 31 and by the same process as the gate electrode 31. The third capacitance electrode layer 70 extends over the second capacitance layer 54 through the interlayer insulating film 15. The third capacitance layer 70 is formed in the same layer as, and by the same process as the drain electrode 36 and the drain signal line 52. The third capacitance electrode layer 70 is connected to the source 33s of the TFT 30 through a contact hole.

That is, the storage capacitance element 130 has a multiple-layer configuration with the second capacitance electrode layer 54 sandwiched by the first capacitance electrode layer 55 and the third capacitance electrode layer 70 through the insulating films. Therefore, the storage capacitance element 130 can form a large capacitance in a relatively small area.

It is also possible to acquire the larger capacitance by extending the cathode layer 65 over the third capacitance electrode layer 70 through the first planarization film 17 and a second planarization film 19.

Next, the organic EL element driving TFT 40 will be explained. The a-Si film is formed on the insulating substrate 10. The a-Si film is irradiated by a laser beam for forming a poly-crystalline silicon film functioning as an active layer 43. The gate insulating film 12, and the gate electrode 41 made of a metal with a high-melting point such as Cr and Mo are deposited on the active layer 43. Channels 43c are formed in the active layer 43. The source 43s and the drain 43d are also formed at both sides of the channels 43c. A $SiO_2$ film, a SiN film and a $SiO_2$ film are sequentially deposited to form the interlayer insulating film 15 on the entire surface of the gate insulating film 12 and the active layer 43. The driving source line 53, which is connected to the driving source by filling a contact hole formed at the location corresponding to the drain 43d with a metal such as Al, is disposed. A source electrode 56 is also formed by filling a contact hole formed at the location corresponding to the source 43s with a metal such as Al.

Furthermore, the first planarization film 17 made of an organic resin for flattening the surface is deposited on the entire surface. A contact hole is formed in the first planarization film 17 at the location corresponding to the source electrode 56. The anode layer 61 of the organic EL element, which is a transparent electrode made of ITO, making contact with the source electrode 56 through the contact hole described above is formed on the first planarization film 17. The second planarization film 19 is further disposed on the first planarization film 17. This film is removed from the area above the anode layer 61.

The organic EL element 60 includes the anode layer 61 made of the transparent electrode such as ITO (Indium Tin Oxide), a hole transportation layer 62 having a first hole transportation layer made of MTDATA (4,4-bis(3-mathylphenylphenylamino)biphenyl) and a second hole transportation layer made of TPD (4,4,4-tris (3-methylphenylphenylamino)triphenylanine), an emissive layer 63 made of Bebq2 (bis(10-hydroxybenzo[h]quinolinato)beryllium) including quinacridone derivative, an electron transportation layer 64 made of Bebq2, and the cathode layer 65 made of either magnesium-indium alloy, aluminum or aluminum alloy.

The holes inputted from the anode layer 61 and the electrons inputted from the cathode layer 65 are re-combined in the emissive layer of the organic EL element 60, activating organic molecules in the emissive layer. When the activated molecules are deactivated due to radiation, light is emitted from the emissive layer, and light then reaches outside through the transparent anode layer 61 and the insulating substrate 10.

Figure 3A:
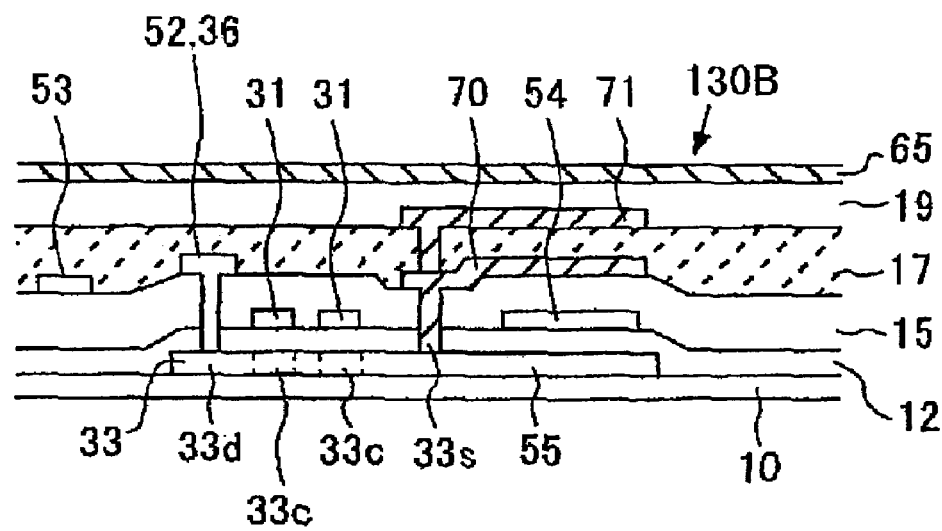
FIGS. 3A and 3B are cross-sectional views of a pixel portion of an organic EL display device of a second embodiment of this invention.
Figure 3B:
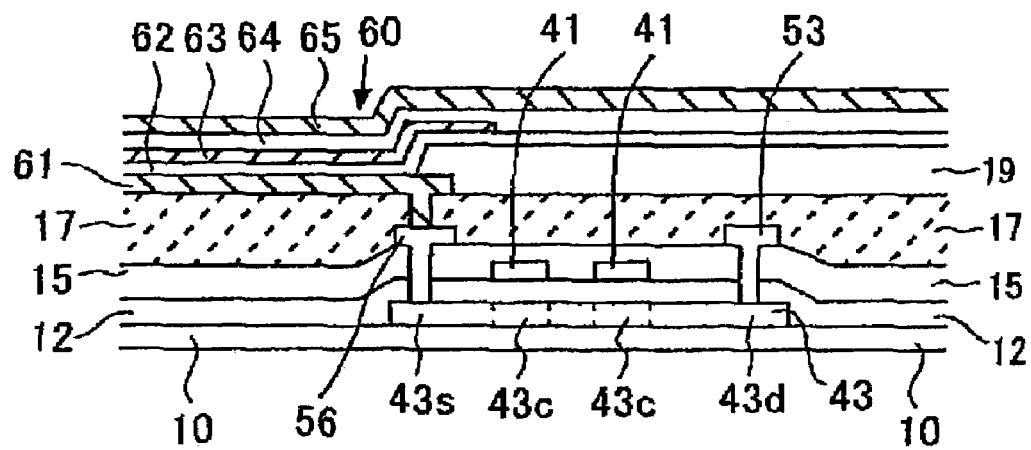

Next, a second embodiment of this invention will be explained. FIGS. 3A and 3B are cross-sectional views of one pixel portion of this embodiment. FIG. 3A is a cross sectional view of the pixel portion along the A-A line of FIG. 1, and FIG. 3B is a cross sectional view along the B-B line of FIG. 1, respectively. The structure f the pixel portion of this embodiment is the same as that of the first embodiment except the capacitance electrode structure described below. The equivalent circuit diagram of the pixel portion of this embodiment is also the same as shown in FIG. 4.

The storage capacitance element 130A has a multiple-layer configuration with the second capacitance electrode layer 54 sandwiched by the first capacitance electrode layer 55 and the third capacitance electrode layer 70 through the insulating films in the first embodiment. The storage capacitance element 130B of the second embodiment has an additional electrode layer to increase capacitance per unit area.

A fourth capacitance electrode layer 71 is deposited extending over the third capacitance electrode layer 70 through the first planarization layer 17 in addition to the configuration of the first embodiment. The fourth capacitance electrode layer 71 is in the same layer as and formed by the same process as the anode layer 61.

Additionally, the cathode layer 65 is deposited extending over the fourth capacitance electrode layer 71 through the second planarization layer 19. The cathode layer 65 functions as a fifth capacitance electrode layer.

In the first embodiment, a capacitance is formed between the third capacitance electrode layer 70 and the cathode layer 65 when the cathode electrode is used as a fourth capacitance electrode layer. Both the first planarization film 17 and the second planarization film 19 function as the capacitance insulating film in this configuration. In the second embodiment, however, a capacitance is formed between the fourth capacitance electrode layer 71 and the cathode layer 65, i.e., the fifth capacitance electrode. Since the second planarization layer 19 is the only layer working as the capacitance insulating layer in this configuration, the capacitance insulating film between the capacitance electrodes facing each other is thinner compared to that of the first embodiment. Accordingly, the corresponding capacitance increases.

What is claimed is:

1. An electroluminescent display device having a plurality of pixel portions, each of the pixel portions comprising:
    an electroluminescent element;
    a driving transistor driving the electroluminescent element;
    a drain signal line;
    a pixel selecting transistor supplying a signal from the drain signal line to a gate of the driving transistor; and
    a storage capacitance element holding the signal supplied to the gate of the driving transistor, the storage capacitance element including an extension of a source of the pixel selecting transistor as a first capacitance electrode layer, a second capacitance electrode layer disposed above the extension of the source, an insulating film disposed on the second capacitance electrode layer and a third capacitance electrode layer connected to the source and disposed on the insulating layer,
    wherein the drain signal line and the third capacitance electrode layer lie in the same plane as a top plane of the insulating film.

2. The electroluminescent display device of claim 1, wherein the second capacitance electrode layer is in a same wiring layer as a gate of the pixel selecting transistor.

3. The electroluminescent display device of claim 1, further comprising a gate insulating film of the pixel selecting transistor, wherein a part of the gate insulating film is disposed between the first and second capacitance electrode layers.

4. The electroluminescent display device of claim 1, further comprising an interlayer insulating film disposed between the gate of the pixel selecting transistor and the drain signal line, wherein a part of the interlayer insulating film is disposed between the second and third capacitance electrode layers.

5. The electroluminescent display device of claim 1, further comprising a cathode electrode layer of the electroluminescent element, the cathode electrode layer extending over the third capacitance electrode layer and being configured to work as a fourth capacitance electrode layer of the storage capacitance element.

6. The electroluminescent display device of claim 1, wherein the source of the pixel selecting transistor extends beyond an edge portion of the third capacitance electrode layer.

7. The electroluminescent display device of claim 1, wherein the drain line and the third capacitance electrode layer are made of the same material.

8. An electroluminescent display device having a plurality of pixel portions, each of the pixel portions comprising:
    an electroluminescent element including an anode layer, an emissive layer and a cathode layer;
    a driving transistor driving the electroluminescent element;
    a drain signal line;
    a pixel selecting transistor supplying a signal from the drain signal line to a gate of the driving transistor; and a storage capacitance element holding the signal supplied to the gate of the driving transistor, the storage capacitance element including an extension of a source of the pixel selecting transistor as a first capacitance electrode layer, a second capacitance electrode layer disposed above the extension of the source, a third capacitance electrode layer connected to the source and disposed above the second capacitance electrode layer, a fourth capacitance electrode layer connected to the third capacitance electrode layer and disposed above the third capacitance electrode layer and a fifth capacitance electrode layer disposed above the fourth capacitance electrode layer and not connected with the fourth capacitance electrode layer, wherein the fifth capacitance electrode layer is an extension of the cathode layer.

9. The electroluminescent display device of claim 8, wherein the second capacitance electrode layer is in a same wiring layer as a gate of the pixel selecting transistor.

10. The electroluminescent display device of claim 8, further comprising a gate insulating film of the pixel selecting transistor, wherein a part of the gate insulating film is disposed between the first and second capacitance electrode layers.

11. The electroluminescent display device of claim 8, wherein the third capacitance electrode layer is in a same wiring layer as the drain signal line.

12. The electroluminescent display device of claim 8, further comprising an interlayer insulating film disposed between the gate of the pixel selecting transistor and the drain signal line, wherein a part of the interlayer insulating film is disposed between the second and third capacitance electrode layers.

13. The electroluminescent display device of claim 8, wherein the fourth capacitance electrode layer is in a same wiring layer as the anode layer.

14. The electroluminescent display device of claim 8, further comprising a planarization layer disposed on the drain signal line, wherein a part of the planarization layer is disposed between the third and fourth capacitance electrode layers.

15. The electroluminescent display device of claim 8, further comprising a planarization layer disposed partially on the anode layer, wherein a part of the planarization layer is disposed between the fourth and fifth capacitance electrode layers.

16. The electroluminescent display device of claim 8, wherein the source of the pixel selecting transistor extends beyond an edge portion of the third capacitance electrode layer.

17. The electroluminescent display device of claim 8, wherein the drain line and the third capacitance electrode layer are made of the same material.

18. An electroluminescent display device having a plurality of pixel portions, each of the pixel portions comprising:

an electroluminescent element;

a driving transistor driving the electroluminescent element;

a drain signal line;

a pixel selecting transistor supplying a signal from the drain signal line to a gate of the driving transistor and comprising a semiconductor layer comprising a source and drain; and a storage capacitance element holding the signal supplied to the gate of the driving transistor, the storage capacitance element comprising a first capacitance electrode layer, a second capacitance electrode layer disposed above the first capacitance electrode layer, an insulating film disposed on the second capacitance electrode layer and a third capacitance electrode layer connected to the source of the pixel selecting transistor and disposed on the insulating layer, wherein the drain signal line and the third capacitance electrode layer lie in the same plane as a top plane of the insulating film, and the first capacitance electrode layer lies in the same plane as the semiconductor layer lies, and the first and third capacitance electrode layers are configured to receive the signal from the drain signal line.

19. The electroluminescent display device of claim 18, wherein the second capacitance electrode layer is in a same wiring layer as a gate of the pixel selecting transistor.

20. The electroluminescent display device of claim 18, further comprising a gate insulating film of the pixel selecting transistor, wherein a part of the gate insulating film is disposed between the first and second capacitance electrode layers.

21. The electroluminescent display device of claim 18, further comprising an interlayer insulating film disposed between the gate of the pixel selecting transistor and the drain signal line, wherein a part of the interlayer insulating film is disposed between the second and third capacitance electrode layers.

22. The electroluminescent display device of claim 18, further comprising a cathode electrode layer of the electroluminescent element, the cathode electrode layer extending over the third capacitance electrode layer and being configured to work as a fourth capacitance electrode layer of the storage capacitance element.

* * * * *